United States Patent [19]

Pimpinella et al.

[11] Patent Number: 4,826,272

[45] Date of Patent: May 2, 1989

[54] MEANS FOR COUPLING AN OPTICAL FIBER TO AN OPTO-ELECTRONIC DEVICE

[75] Inventors: Richard J. Pimpinella, Hampton; John M. Segelken, Morristown, both of N.J.

[73] Assignee: American Telephone and Telegraph Company AT&T Bell Laboratories, Murray Hill, N.J.

[21] Appl. No.: 90,263

[22] Filed: Aug. 27, 1987

[51] Int. Cl.[4] .......................... G02B 6/36; G02B 7/26
[52] U.S. Cl. ............................... 350/96.20; 350/96.17
[58] Field of Search ......................... 350/96.17, 96.20; 357/74

[56] References Cited

U.S. PATENT DOCUMENTS

| | | | |
|---|---|---|---|
| 4,257,672 | 3/1981 | Balliet | 350/96.17 |
| 4,307,935 | 12/1981 | Monnier | 350/96.17 |
| 4,483,067 | 11/1984 | Parmentier | 357/74 |
| 4,656,352 | 4/1987 | Langenwalter et al. | 350/96.20 |
| 4,675,717 | 6/1987 | Herrero et al. | 357/71 |

OTHER PUBLICATIONS

*Optical Microlithography II* (1983), "Germanium–Selenium (Ge-Se) Based Resist Systems for Submicron VLSI Application", by E. Ong et al., pp. 39–48.

*Primary Examiner*—William L. Sikes
*Assistant Examiner*—Robert E. Wise
*Attorney, Agent, or Firm*—Eugen E. Pacher

[57] ABSTRACT

The disclosed means for coupling an optical fiber and an opto-electronic device (e.g., LED, Laser, or photodetector) comprises a first body having two substantially parallel major surfaces, with a recessed portion (a "well") formed in one surface, and a through-aperture extending from the other surface to the well. Conductive means extend from the former surface onto the bottom of the well, and the opto-electronic device is to be mounted in the well such that the device does not protrude above the plane of the associated surface, such that electrical contact is established between the device and the conductive means, and such that the active region of the device is centered upon the through-aperture. The first body is advantageously from a (100) Si wafer by means of standard Si processing techniques, including selective etching. The assembly can be mounted on a substrate, e.g., a Si wafer with appropriate metallization thereon, and the end of an optical fiber inserted into the through-aperture and secured to the first body. The assembly can be operated at relatively high speed, due to its relatively low parasitic capacitance and inductance, and can be mounted on the substrate in substantially the same way as IC chips are mounted, in close proximity to associated electrical components.

11 Claims, 4 Drawing Sheets

MEANS FOR COUPLING AN OPTICAL FIBER TO AN OPTO-ELECTRONIC DEVICE

FIELD OF THE INVENTION

This invention pertains to optical fiber coupling means and, more particularly, to coupling means designed for coupling an optical fiber to an opto-electronic device such as an optical emitter or detector.

BACKGROUND OF THE INVENTION

Optical fiber is increasingly used in a variety of applications ranging from long distance voice and data transmission to interconnection of electronic devices, subassemblies, or assemblies. In many, perhaps all, applications of optical fiber, it is necessary to couple a source of electromagnetic radiation of appropriate wavelength such as a light-emitting diode or a semiconductor laser to the fiber, and/or to couple a detector of electromagnetic radiation (e.g., a PIN diode) to the fiber.

Although there exist many applications (e.g., in intercontinental or inter-city optical fiber communications systems) that demand very high coupling efficiency, there are also many significant applications (e.g., in the local loop portions of fiber communication systems, in local area networks, or optical interconnects of components of electronic systems such as 5ESS ® electronic switches) that do not require such high coupling efficiency. In the latter case coupling losses of 1 db and even high frequently will be acceptable. Relaxation of coupling efficiency requirements typically translates into a simpler design and thus into a lower cost coupling means.

The desirability of providing moderately efficient, inexpensive and compact means for optically coupling an opto-electronic device to the end of a fiber has become recognized. Desirably, such means are compatible with IC (integrated circuit) mounting technology, since such compatibility typically simplifies assembly and thus results in significant cost reduction. For an example of an advanced mounting technique see, for instance, U.S. Pat. No. 4,675,717, incorporated herein by reference.

A fiber-to-device coupling assembly that is compatible with IC technology is disclosed in U.S. patent Ser. No. 4,779,946, filed Feb. 14, 1986 for R. J. Pimpinella and J. M. Segelken, incorporated herein by reference. This prior art coupling assembly utilizes a Si chip comprising a through-aperture to maintain the end of an optical fiber in coupling relationship with an opto-electronic component mounted on the chip. The chip exemplarily is produced by a process that comprises selective etching of one face of a Si wafer to form sloped-wall through-apertures, formation of metallization patterns on the other face of the wafer in precise alignment with respect to these apertures, and dicing of the wafer. The end of an optical fiber is inserted into the aperture and maintained therein by appropriate means, and an appropriate opto-electronic device (transducer) is aligned with the metallization pattern and conductively attached thereto. Alignment between the core of the optical fiber and the active area of the transducer results from the precise placement of the metallization pattern and the alignment of the transducer with the pattern. The thus formed assembly can then be mounted on an appropriate substrate (e.g., a Si wafer with appropriate metallization thereon) substantially in the same manner as ordinary IC chips, e.g., by means of a face-down solder ball technique.

Although providing a significant advance over other prior art coupling assemblies, the above described assembly has some shortcomings. In particular, the assembly requires use of conductive "contact blocks" to make possible mounting of the assembly on a laterally extending substrate, e.g., a silicon wafer as used in the above referred to advanced interconnection method. Such contact blocks are relatively large and therefore limit the maximum frequency of operation of the assembly, due to the relatively high capacitance associated with the contact blocks. Furthermore, in order to attain acceptable optical coupling between the fiber and a transducer the metallization patterns have to be in accurate alignment with the fiber-receiving aperture (which frequently is difficult to achieve), and the transducer has to be affixed to the face of the silicon block in precise registry with the metallization pattern. Typically, no opportunity exists to compensate for such unavoidable imperfections as variations in the placement of the active area of the opto-electronic device relative to the metallization pattern.

In view of the above discussion, it will be apparent that compact, relatively low cost means for coupling an optical fiber to an opto-electronic device that are compatible with current and many anticipated IC mounting techniques and that are compatible with the relatively high signal transmission rates that are possible in optical fiber communications would be highly desirable. We are disclosing herein such coupling means.

SUMMARY OF THE INVENTION

In a broad sense we are disclosing means for coupling an opto-electronic device to an optical fiber that can be mounted on a base member in substantially the same way as an IC chip, and that can be operated at relatively high speed, due to a significant reduction in parasitic capacitance and inductance, as compared to prior art coupling means. Furthermore, the ability to place inventive connectors in close proximity to driver or receiver ICs (e.g., within about 0.5 mm or less) results typically in reduced noise susceptibility, and consequently in improved system performance. In preferred embodiments, the means comprise a Si member that is produced in batch fashion using techniques commonly practiced in semiconductor device manufacture. Various embodiments of the invention will be disclosed, with some embodiments permitting coupling of the device to a fiber whose end is substantially normal to the member, and other embodiments permitting coupling to fiber whose end is substantially parallel to the member.

Typically, the invention is embodied in an assembly that comprises at least a first body (typically a monocrystalline silicon block) having at least two opposed essentially parallel major faces (to be referred to as the first and the second face) and at least one through-aperture having a main longitudinal axis essentially perpendicular to the faces. The first body further comprises at least one recessed portion (herein referred to as a "well") in the second face, the aperture extending between the first face and the well, the well being adapted for having mounted therein at least one opto-electronic device such that the device does not project above the plane of the second face. By a "well" we mean herein a depression in a face of a body, the depression typically having substantially larger lateral extent than depth, and typically having a substantially plane bottom. The first body further comprises conductive means, extending from the second face into the well and typically comprising bonding pads located on the second face, with the conductive means being adapted for making electrical contact with an opto-electronic device mounted in the well.

In one aspect the assembly comprises an opto-electronic device (e.g., a semiconductor laser, LED, or a PIN detector) mounted in the well in electrical contact with the conductive means and not projecting above the plane of the second face, and the assembly further comprises means for securing an end of an optical fiber to the assembly. The fiber-securing means are adapted for maintaining the secured fiber end such that the fiber is in a position adapted for optical communication between the opto-electronic device and the fiber.

By a "position adapted for optical communication between A and B" we mean herein that A is positioned relative to B such that light or other relevant electromagnetic radiation emitted by A (or B) impinges on B (or A) such that at least a substantial fraction of the emitted radiation is coupled into B (or A). Exemplarily, B is an optical fiber or a radiation detector, and radiation emitted by A is coupled into the core of the fiber or impinges on the active area of the detector, respectively.

Coupling assemblies according to the invention can be used advantageously in a variety of apparatus or systems that comprise both electronic components and optical fiber signal transmission means. For instance, such assemblies can be used in electronic systems in which subsystems communicate by means of optical signals transmitted through optical fiber. Exemplary of such electronic systems is an electronic switching system, namely AT&T's 5ESS ®. Those skilled in the art will undoubtedly find a multiplicity of uses for coupling assemblies according to the invention, particularly in light of one of its advantageous features, namely, ready compatibility with many mounting techniques, including advanced techniques that comprise face-down solder bonding of Si chips or chip-like components to bonding pads on a substrate, typically an appropriately metalized silicon wafer. Frequently the parasitic capacitance associated with a coupler according to the invention is less than about 100 fF and can be as low as about 10 fF. The reduced number of wirebonds, compared to many prior art devices, typically results in relatively low parasitic inductance.

BRIEF DESCRIPTION OF THE DRAWINGS

All Figures are schematic and not drawn to scale. If a given feature is shown in more then one figure then the same numeral is used to identify the feature in all the figures.

DETAILED DESCRIPTION OF SOME PREFERRED EMBODIMENTS

Figure 1:
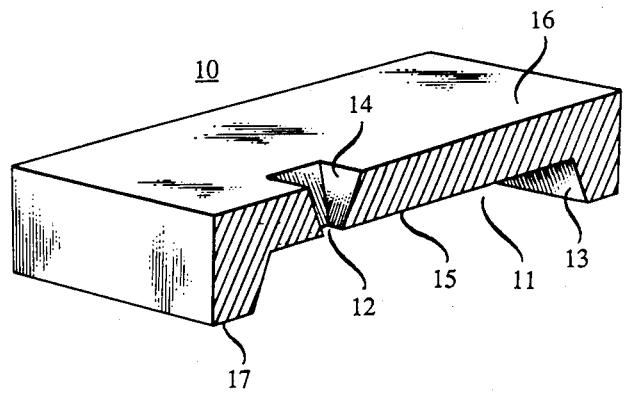
FIG. 1 shows in cross section an exemplary first body.

A common feature of the preferred embodiments of the inventive coupling assembly is the presence of a first body comprising a well, and FIG. 1 schematically depicts in cross section an exemplary first body 10. The first body 10 not only comprises a well 11 in second face 17 (the well exemplarily having sloping side walls 13 and substantially flat bottom 15) but also a through-aperture 12 (having sloping side walls 14) extending from first face 16 to the well.

A body of the type shown in FIG. 1 advantageously comprises monocrystalline Si, although in principle other materials (e.g., Ge, ceramics) could also be used. Among the advantages of Si is the ease and economy with which such bodies can be produced to very close tolerances, due to the existence of highly developed processing techniques that include photolithography and preferential etching. These techniques are well known and do not need detailed review.

Advantageously, a multiplicity of first bodies 10 is produced by processing a conventional Si wafer (exemplarily 75–150) mm diameter, approximate thickness 0.55 mm, (100) crystalline orientation) in a series of processing steps that typically comprise formation of an etch-resistant layer (e.g., $SiO_2$) on both the top and the bottom face of the wafer, application of resist material to these layers, and patterning of the resist layers by standard lithographic techniques. Subsequently, the patterned resist layers are used as masks for patterning the underlying etch-resistant layers, for instance, by means of a conventional plasma-assisted or wet etching process. After removal of the resist pattern the exposed portions of the Si wafer are etched. Whereas the outlined processing can be (but need not be) carried out on one wafer face at a time, it is typically advantageous to simultaneously etch the exposed portions of both sides of the Si wafer.

If the first body is fabricated from a (100)-oriented Si wafer then sloping walls 13 and 14 advantageously are substantially parallel to (111) crystal planes. Means for preferentially forming (111)-oriented features in (100) Si are known, and include KOH dissolved in deionized water and propanol. By lithographically defining the dimensions of the openings etched in the first surface of the wafer it is possible to control the dimensions of the aperture formed in the bottom of the well. Thus, if the wafer thickness is 500 $\mu$m, etching of both faces proceeds simultaneously, and the window in the etch resistant layer on the first face is 454 $\mu$m square then the aperture will be about 100 $\mu$m square, since typically the etch rate of the first and second face features are the same, and the angle between the first face and the sloping sidewalls of the aperture is approximately 54.74 degrees.

Figure 2:
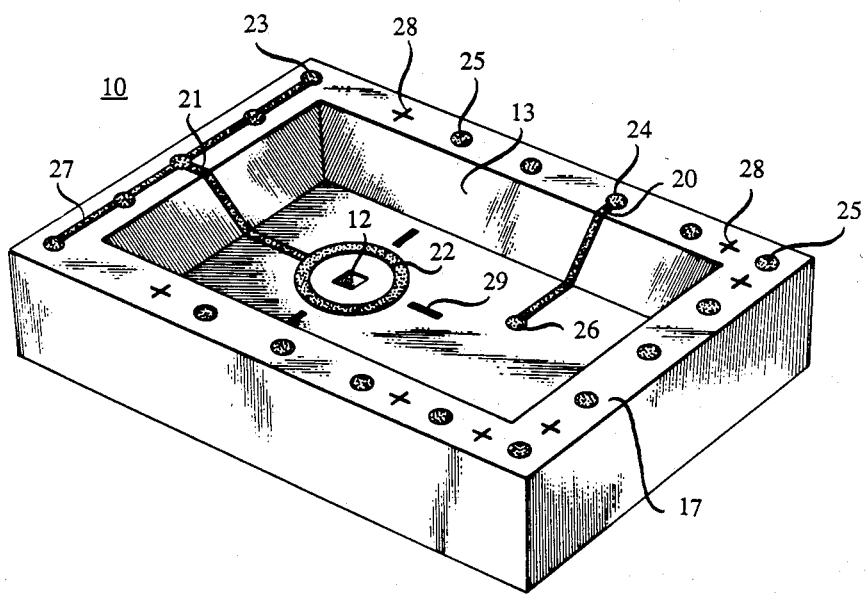
FIG. 2 depicts one face of the first body with conductive means thereon.

Next, the second face of the wafer typically is processed to form appropriate conductive features thereon. Exemplary features are shown in FIG. 2, wherein 22 is an annular conductor surrounding the opening in the well bottom, 27 is a linear conductor connecting bonding pads 23 on the second face, and 21 is a linear conductor connecting 22 and 27. Bonding pad 24 on the second face is connected by means of conductor 20 to bonding pad 26 on the bottom of the well. Bonding pads 25 are (optional) spares that are not joined to any conductive feature in this exemplary embodiment, but that provide additional structural support and thermal conduction paths when the assembly is mounted on a substrate. Fiducial marks 28 and 29 are optional alignment features. The conductive features are formed using non-planar lithographic process that comprises vacuum-deposition of $Ag_2Se/Ge_xSe_{1-x}$ resist (see, for instance, E. Ong et al, SPIE Vol. 394, *Optical Microlithography II*, pp. 39-48, 1983), selective exposure of the resist layer in a standard contact printer, and development in a tetramethylammonium hydroxide/sodium sulfide bath.

Even though both FIGS. 1 and 2 show an individual body 10, it will be appreciated that the processing up to and including formation of the metallization typically and advantageously is carried out on a wafer containing hundreds or even thousands of potential bodies 10. Such a wafer is then diced by a known technique such that a multiplicity of processed bodies results (exemplarily of approximate dimensions $2 \times 2$ mm), of which body 10 of FIG. 2 is representative. It will also be appreciated that the invention is not limited to an assembly comprising one well and one aperture, but instead can be embodied in a variety of designs, including assemblies for coupling a multiplicity of fibers to a multiplicity of opto-electronic devices and comprising a multiplicity of through-apertures and one or more wells.

Figure 3:
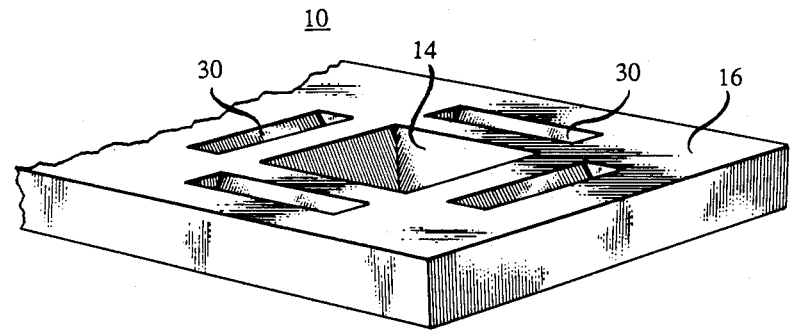
FIG. 3 shows the other face of the first body.

FIG. 3 schematically shows body 10 in a view that reveals features of the first surface, namely, through-aperture 12, an optional grooves 30. The grooves are advantageously produced by selective etching and will typically enhance the adhesion to the first body of epoxy or other substance used to attach an optical fiber to the body.

Figure 4:
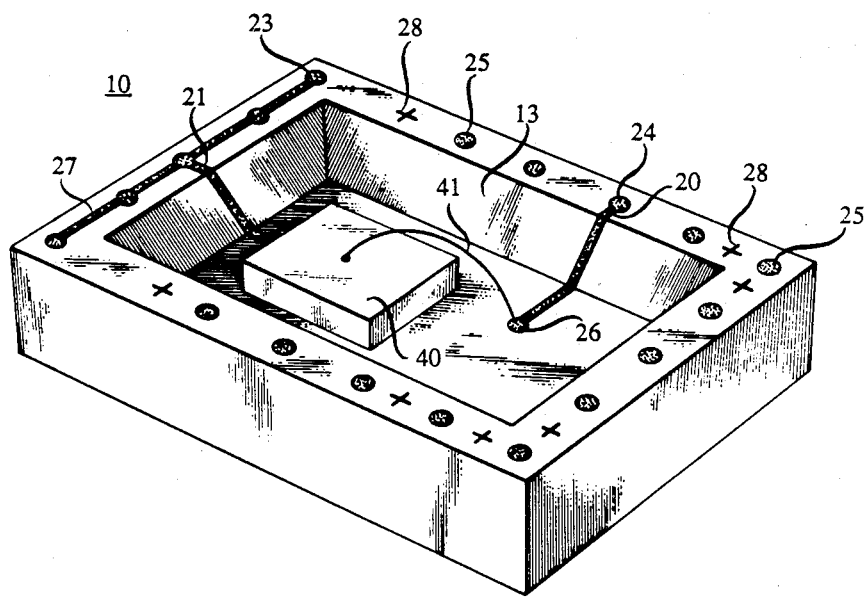
FIG. 4 shows the first body, with an opto-electronic device mounted in the well of the body.

FIG. 4 schematically depicts a body 10, with opto-electronic device 40 (exemplarily a PIN diode) placed face down into the well such that the active area of the device is over the opening in the well bottom, and the device is conductively connected to the conductive means that extend from the second face into the well. Exemplarily, an annular conductor on the front face (as depicted in FIG. 4 this is the lower major surface) of the device 40 is conductively bonded (e.g., by means of solder or epoxy) to the corresponding feature on the bottom of the well, and wire 41 is bonded, by a known technique, to the bonding pad (26 of FIG. 2) and to a metallized region on the back face of the device.

Figure 5:
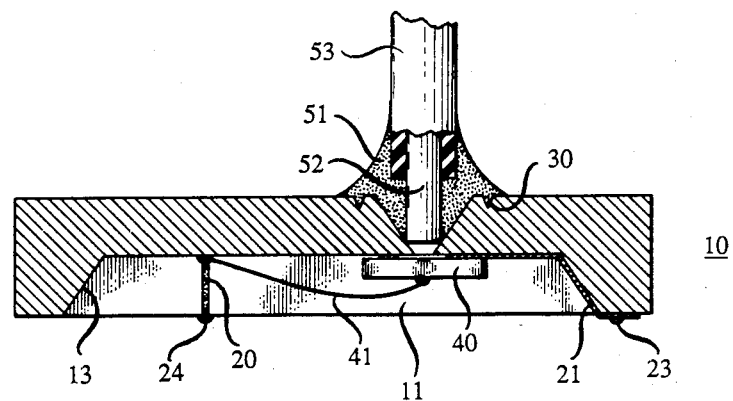
FIG. 5 depicts coupling means according to the invention.

FIG. 5 shows schematically and in cross section a coupling assembly according to the invention, with an opto-electronic device 40 conductively attached to the conductive features on first body 10 in the manner described above, and with an optical fiber 52 maintained in a position adapted for optical communication between the fiber and the opto-electronic device. The fiber is shown to have a stripped back coating 53 and is attached to the first body by adhesive means 51, e.g., epoxy. Other attachment means are known to the art and can be used if desired.

A coupler according to the invention can be assembled in any convenient manner. For instance, the fiber can be inserted into the aperture and adhesively secured to the first body, the opto-electronic device can be placed into the well, be positioned coarsely and temporary electrical connections established. The device can then be energized and its position varied until maximum coupling between fiber and device is attained, upon which the device is permanently secured in the well. For instance, if the device is a detector then radiation of the appropriate wavelength can be coupled into the fiber such that it is guided to the coupling assembly and impinges upon the active region of the device. The position is fine adjusted by maximizing the output of the detector.

In a currently preferred assembly procedure the opto-electronic device is placed, by means of robotic equipment, into the well such that the active region of the device is centered upon the opening in the bottom of the well, and secured to the first body such that electrical contact is established between the annular conductor on the bottom of the well and the corresponding conductor on the front face of the device. The presence of the above referred to optional fiducial marks can aid in the precise placement of the device, such that typically the desired coupling efficiency (exemplarily $<2$ db coupling loss) can be attained without active alignment of the device.

After completion of the electrical connections to the device (e.g., by wire bonding) and mounting of the assembly on an appropriate substrate an appropriately prepared (e.g., cleaved and/or polished) stripped end of an optical fiber is inserted into the aperture and secured to the first body such that the axis of the secured end of the aperture is substantially parallel to the axis of the aperture. Optionally, it is possible to introduce index matching material between the end of the fiber and the front face of the device.

Figure 6:
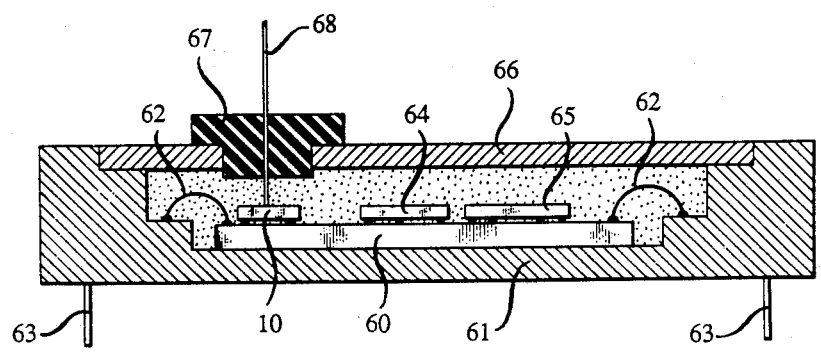
FIG. 6 shows an assembly comprising inventive coupling means and strain relief means.

Frequently it will be found desirable to provide strain relief means to assure the physical integrity of the coupling assembly under the stresses normally encountered. In particular, means for providing strain relief of the fiber with respect to the first body are advantageously provided. Such means can be readily devised by those skilled in the art, and a particular embodiment is schematically depicted in FIG. 6, wherein numeral 10 refers to a coupling assembly according to the invention (the opto-electronic device is not shown), with a length of optical fiber attached thereto. The coupling assembly is conductively mounted on an appropriate substrate 60, exemplarily a Si substrate of the type described in U.S. Pat. No. 4,675,717, which is an example of an approach frequently referred to as wafer-scale integration. Shown are also IC chips 64 and 65, representative of a wide variety of chips that can be used in conjunction with the inventive coupling means, which are also mounted conductively on the substrate, e.g., by means of solder attachment, as is schematically indicated in the drawing. Substrate 60 in turn typically is mounted on a further substrate 61, exemplarily a multilayer ceramic body comprising appropriate metallization. Electrical connections between 60 and 61 are provided by conventional means, as is schematically indicated by means of wires 62, each bonded to a bonding pad each on 60 and on 61. Means are provided to make electrical contact with substrate 61, exemplarily indicated by contact pins 63, arranged, for instance, such as to permit plugging the depicted assembly into an appropriate socket. Strain relief for the optical fiber is provided by means of lid 66 and inset 67, the latter closely surrounding the fiber 68. The lid typically is adhesively secured to the substrate, and the inset typically is similarly secured to the lid. The fiber optionally is secured to the inset with epoxy or other appropriate means.

Figure 7:
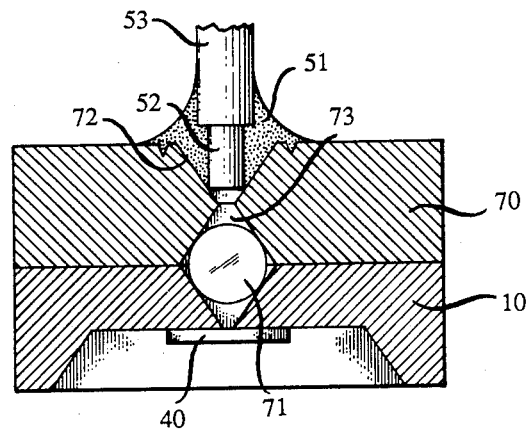
FIGS. 7 and 8 show further coupling means according to the invention.

FIG. 7 schematically depicts an exemplary further embodiment of the invention. Numeral 10 refers again to a first body, with opto-electronic device 40 mounted in the well, and 70 refers to a second body that advantageously also is manufactured from single crystal Si. The second body comprises a through-aperture adapted for accepting therein an end of an optical fiber 52, and further comprises means that permit introduction of radiation focusing means between the end of the fiber and the opto-electronic device. Exemplarily the through-aperture in the second body has the shape of two truncated pyramids 72 and 73 that meet at their truncation planes, as indicated in FIG. 7, and the focusing means comprise spherical lens 71 (e.g., a sapphire sphere) that is confined in the space provided by the through-apertures. Desirably the inventive assembly is designed such that the end of the optical fiber is in one focal plane of lens 71 and the active region of the device 40 is in the other focal plane. The through-aperture of the second body can readily be produced by lithography and selective etching if the second body is (100) oriented Si. It will be appreciated that the through-apertures need not be pyramid-shaped but could have other configurations, e.g., be substantially coneshaped.

After placing the focusing means 71 into the space provided therefor, typically the second body is secured to the first body, e.g., by means of an adhesive layer at the interface, or by clamping means (not shown) to form a separable connector, and the fiber is secured to the second body, e.g., by means of a quantity of epoxy 51. If desired, positional fine adjustment can be carried out to further increase the coupling efficiency. Optionally index matching material can be placed into the space between the fiber and the lens and the lens and the device. Electrical contact with the device is established substantially as discussed above. Strain relief can be provided, e.g., substantially as shown in FIG. 6.

Figure 8:
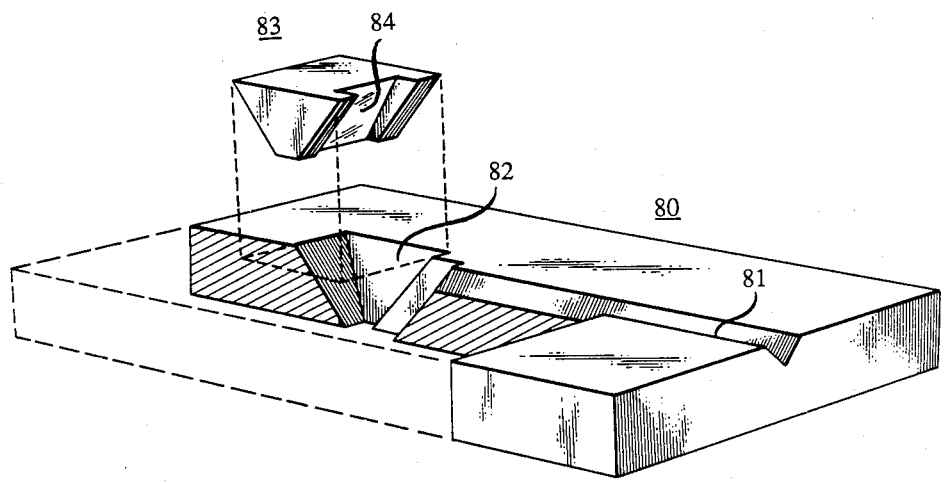

In both of the above discussed embodiments of the invention, the axis of the attached optical fiber is substantially normal to the faces of the first body. However, this is not necessarily the case, and FIG. 8 schematically depicts an embodiment wherein the axis of the attached optical fiber is substantially parallel to the faces of body 80. Groove 81 is optionally provided to receive the end of a length of optical fiber, and is advantageously formed by means of photolithography and selective etching, as is through-aperture 82, which advantageously is defined entirely by [111] facets. Body 80 further can comprise a well (and associated conductive means, etc.) substantially as previously described first body 10, or it can comprise a feature that permits accommodation of focusing means, substantially as described above in conjunction with FIG. 7. In either case means are provided for reflecting a light beam such that a fiber mounted such that its end is substantially parallel with the faces of body 80 is optically coupled with an opto-electronic device mounted in the well of a first body. Exemplary means for accomplishing this purpose are also depicted in FIG. 8, wherein block 83 is shaped to fit into through-aperture 82 as indicated. Face 84 of the block typically is metallized such as to be a good reflector of radiation at the operating wavelength of the coupling assembly, and is oriented so as to be substantially at 45° with respect to the fiber axis. Block 83 can be made from Si by selective etching and other known micromachining procedures, but it can also be made from other materials (e.g., molded plastics). It will be appreciated that inventive coupling assemblies with fibers entering parallel to the faces of the first body can be mounted in substantially the same way as assemblies with perpendicular fiber entry, with obvious modifications of the strain relief means typically being required.

Finally, it is to be understood that the above-described structures and processing techniques are only illustrative of the principles of the present invention. In accordance with these principles, numerous modifications and alternatives may be devised by those skilled in the art without departing from the spirit and scope of the invention. Thus, for example, although primary emphasis herein has been directed to coupling assemblies made of silicon, it is apparent that blocks made of other materials may also be lithographically patterned in the unique way described herein to form microminiature coupling assemblies.

What is claimed is:

1. An assembly comprising a first body having two opposed substantially parallel faces (to be referred to as the first and the second face) and at least one through-aperture having a longitudinal axis substantially perpendicular to the first face, characterized in that the first body further comprises
    (a) at least one recessed portion in the second face, the portion having a bottom, the through-aperture extending between the first face and the bottom of the portion; and
    (b) conductive means, extending from the second face onto the bottom of the portion and adapted for making electrical contact to an opto-electronic device having an active region and mounted in the well such that the device does not project above the plane of the second face, with the active region substantially centered on the through-aperture; and the assembly further comprises
    (c) means for securing an end of an optical fiber to the assembly such that the fiber is in a position adapted for optical communication between the opto-electronic device and the fiber, said securing means being adapted for
        (i) securing the optical fiber directly to the first body, or
        (ii) securing the optical fiber directly to a second body having two opposed substantially parallel faces, with at least one through-aperture extending between the faces, the second body to be attached to the first body.

2. The assembly of claim 1, comprising an optical fiber secured to the first body, and an opto-electronic device mounted in the recessed portion and electrically connected to the conductive means.

3. The assembly of claim 2, wherein the end of the fiber is inserted into the through-aperture substantially parallel with the longitudinal axis thereof.

4. The assembly of claim 2, wherein the end of the fiber is secured to the first face ans is substantially parallel with the first face, and wherein the assembly further comprises light reflecting means positioned such as to facilitate the optical communication between the opto-electronic device and the fiber.

5. The assembly of claim 2, further comprising a planar wafer-scale-integrated structure having bonding pads thereon, with the first body mounted on the planar structure such that at least some of the conductive means on the second face are electrically connected to bonding pads.

6. The assembly of claim 5, further comprising at least one integrated circuit chip mounted on the planar structure in close proximity to the first body.

7. The assembly of claim 1, comprising an opto-electronic device mounted in the recessed portion and electrically connected to the conductive means, further comprising an optical fiber secured to the second body and having an end face, and still further comprising light focusing means having a first and a second focal plane, with the active region of the opto-electronic device lying substantially in the first focal plane and the end face of the fiber lying substantially in the second focal plane.

8. The assembly of claim 7, wherein the light focusing means comprise a spherical lense.

9. The assembly of claim 7, wherein the end of the fiber is inserted into the second body substantially parallel with the longitudinal axis of the through-aperture of the first body.

10. The assembly of claim 7, wherein the end of the fiber is substantially parallel with the opposed faces of the second body, and wherein the assembly further comprises light reflecting means. positioned such as to facilitate the optical communication between the opto-electronic device and the fiber.

11. The assembly of claim 1, wherein the first body comprises monocrystalline silicon.

* * * * *